United States Patent [19]

Kitteridge et al.

[11] Patent Number: 5,609,987
[45] Date of Patent: Mar. 11, 1997

US005609987A

[54] IMPROVEMENTS IN OR RELATING TO PRINTING PLATES

[75] Inventors: John M. Kitteridge, Leeds; Andrew E. Matthews, Nr. Stamford; Philip J. Watkiss, Leeds, all of United Kingdom

[73] Assignee: Du Pont (U.K.) Limited, Herts, United Kingdom

[21] Appl. No.: 513,034

[22] Filed: Aug. 9, 1995

Related U.S. Application Data

[63] Continuation of Ser. No. 249,774, May 26, 1994, abandoned, which is a continuation of Ser. No. 28,089, Jan. 29, 1993, abandoned.

[30] Foreign Application Priority Data

Feb. 13, 1992 [GB] United Kingdom ............... 9202985

[51] Int. Cl.$^6$ .................... G03F 7/038; G03F 7/30
[52] U.S. Cl. .................. 430/265; 430/264; 430/627; 430/628; 430/949
[58] Field of Search ................. 430/264, 265, 430/627, 628, 949, 302

[56] References Cited

U.S. PATENT DOCUMENTS

| | | | |
|---|---|---|---|
| 2,949,442 | 8/1960 | Clavier et al. | 430/627 |
| 3,146,104 | 8/1964 | Yackel et al. | 430/302 |
| 3,702,249 | 11/1972 | Bowman | 96/84 R |
| 4,221,858 | 9/1980 | Shiba et al. | 430/627 |
| 4,315,071 | 2/1982 | Fitzgerald et al. | 430/627 |
| 4,350,759 | 9/1982 | Fitzgerald et al. | 430/627 |
| 4,735,887 | 4/1988 | Foss et al. | 430/264 |
| 5,118,583 | 6/1992 | Kondo et al. | 430/309 |

FOREIGN PATENT DOCUMENTS

| | | |
|---|---|---|
| 0329607 | 8/1989 | European Pat. Off. . |
| 967208 | 8/1964 | United Kingdom . |
| 1316541 | 5/1973 | United Kingdom . |
| 1571155 | 7/1980 | United Kingdom . |

OTHER PUBLICATIONS

Grant & Hackh's Chemical Dictionary, Fifth Edition 1987 p. 293.

*Primary Examiner*—Cynthia Hamilton

[57] ABSTRACT

A hydrophobic synthetic resin is used to partially or completely replace the hydrophilic colloid conventionally used in silver halide emulsions to obtain a radiation sensitive composition useful in the manufacture of radiation sensitive plates for use in printing plate production by image-wise exposure, tanning development, and washing. The synthetic resin includes a plurality of primary amino groups and optionally acidic groups and is soluble in aqueous or semi-aqueous alkaline solution.

11 Claims, No Drawings

IMPROVEMENTS IN OR RELATING TO PRINTING PLATES

This is a continuation, of application Ser. No. 08/249,774 filed May 26, 1994 now abandoned, which is a continuation, of application Ser. No. 08/028,089 filed Jan. 29, 1993, now abandoned.

This invention relates to radiation sensitive compositions and is concerned with such compositions based on silver halide photosensitive materials which are tanning-developable and which are useful in the preparation of printing plates.

Silver halide photosensitive materials which can be tanning-developed to form relief images are well known, e.g. as described by T H James in "The Theory of the Photographic Process", 4th edition, pages 326–327 (1977). Tanning-development of radiation sensitive plates based on silver halide photosensitive materials has also been used for the production of printing plates, for example as described in G.B. patents 726,543; 978,744; 1,084,512; 1,112,393; 1,318,213; 1,547,040; 1,547,350; 1,567,844; 1,571,155; 1,590,058; and 2,040,060 and U.S. Pat. Nos. 3,620,737; 3,669,018; and 4,115,118.

Printing plates made by methods described in the above patents have a number of defects. These defects, attributable to the use of gelatin as the cross-linkable (tannable) material, are—
1. Poor image ink receptivity.
2. Excessive image water sensitivity.
3. Poor image abrasion resistance.

Problem (1) can be overcome by the addition of oleophilic materials to the silver halide or by applying an oleophilic overcoat as described in G.B. patents 1,567,844; 1,571,155 and 1,590,058. However defects (2) and (3) are not overcome by following the teachings in these patents and these defects show up as a low printing run length on the press.

It is an object of the present invention to overcome these defects and provide radiation sensitive plates of high radiation sensitivity from which printing plates having a long press lifetime can be produced.

According to one aspect of the present invention there is provided a radiation sensitive composition comprising a silver halide photosensitive material in admixture with a hydrophobic synthetic resin which includes a plurality of primary amino groups and which is soluble in aqueous or semi-aqueous alkaline solution.

The radiation sensitive composition may be coated onto a substrate having a hydrophilic surface to form a radiation sensitive plate. Such a plate can be used to produce a printing plate.

Accordingly, another aspect of the present invention provides a method of preparing a lithographic printing plate which comprises (i) providing a radiation sensitive plate comprising a substrate having a hydrophilic surface coated with a layer of a radiation sensitive composition comprising a silver halide photosensitive material in admixture with a hydrophobic synthetic resin which includes a plurality of primary amino groups and which is soluble in aqueous or semi-aqueous alkaline solution, (ii) image-wise exposing the composition to actinic radiation, (iii) subjecting the image-wise exposed composition to tanning-development in the presence of a tanning-development agent whereby the radiation-struck areas of the composition become tanned, and (iv) washing out the untanned areas of the composition to reveal the hydrophilic surface of the substrate while leaving the tanned areas of the composition as a relief image.

The hydrophobic synthetic resin used in accordance with the present invention has the combined properties of oleophilicity, tannability and solubility in aqueous media and has the following characteristics:

1. A plurality of amino groups.
2. Solubility in aqueous or semi-aqueous alkaline solution.
3. A low sensitivity to water when cross-linked (tanned) through the amino groups.

In a particularly preferred embodiment, the synthetic resin includes acidic groups in addition to the primary amino groups and hydrophobic groups. Suitable resins of this type are addition polymers comprising repeating units (a), (b) and (c) where units (a) are derived from an ethylenically unsaturated monomer containing one or more primary amino groups, units (b) are derived from an ethylenically unsaturated monomer containing one or more acidic groups such as carboxylic, sulphonic, phosphonic, sulphinic, phosphinic and like acid groups, and sulphonamide groups and units (c) are derived from an ethylenically unsaturated monomer containing one or more hydrophobic groups such as alkyl and aryl groups.

These amphoteric addition polymers generally have an isoelectric point of 4 to 8, preferably 5 to 7 and may have a number average molecular weight in the range 5,000 to 200,000 as determined by gel permeation chromatography. While one type of each of units (a), (b) and (c) is required in the polymer, the polymer can have more than one type of unit (a), more than one type of unit (b) and/or more than one type of unit (c) present therein. Such polymers preferably comprise 1 to 20 mole percent of primary amine units, 5 to 40 mole percent of acid units, and 10 to 85 mole percent of hydrophobic units.

Examples of suitable addition polymers are:—

1. The polymer derived from methacrylic acid, methylmethacrylate, laurylmethacrylate, and N-(3-aminopropyl)methacrylamide hydrochloride in the ratio of 3:5:1:1, respectively by weight.

2. The polymer derived from methacrylic acid, methylmethacrylate, and N-(3-aminopropyl)methacrylamide hydrochloride in the ratio of 2:7:1, respectively by weight.

3. The polymer derived from methacrylic acid, methylmethacrylate, laurylmethacrylate, and 2-aminoethylmethacrylate hydrochloride in the ratio of 3:5:1:1, respectively by weight.

Suitable primary amino group containing monomers for use in the preparation of the addition polymers, include:
N-(3-aminopropyl)methacrylamide
N-(2-aminoethyl)methacrylamide
2-aminoethyl methacrylate
2-aminoethylacrylate
3-aminopropylacrylate
3-amino-2-hydroxy-propylmethacrylate Allylamine Suitable carboxylic acid containing monomers for use in the preparation of the addition polymers, include:
Methacrylic acid
Acrylic acid
Itaconic acid
Maleic acid
Butyl hydrogen maleate Suitable monomers containing hydrophobic groups for use in the preparation of the addition polymers, include:
Methyl methacrylate Ethyl acrylate
Butyl acrylate
Lauryl methacrylate
N-tert-Butylacrylamide
N-tert-Octylmethacrylamide
Styrene The addition polymer may also be derived from other monomers whose presence may modify the properties of the polymer e.g. its toughness, flexibility, adhesion, cross-linking on baking, etc. However, such other monomers should not be present in amounts sufficient to interfere with the aforementioned properties of the polymer. Examples of suitable other monomers are:

Acrylonitrile
N,N-Dimethylaminoethyl methacrylate
Acrylamide
2-Hydroxyethylmethacrylate
2-Acrylamido-2-methylpropanesulphonic acid The monomers are polymerised to form the addition polymer by free-radical processes. The polymerisation may be carried out by emulsion techniques or by solution techniques. Various initiators may be used in the polymerisation and the choice of initiator is determined by the polymerisation conditions selected and the monomers used. Examples of suitable initiators are azoisobutyronitrile; $4,4^1$-azo-bis(4 cyano-valeric acid); di-tert-butyl peroxide; hydrogen peroxide; $2,2^1$-azobis(2-methylpropionamidine)dihydrochloride; potassium-persulphate. Solution polymerisation in aqueous isopropanol is preferred. The polymerisation can be accomplished by batch or continuous processes. The batch process can include controlled addition of monomers and initiator.

Alternatively a suitable synthetic resin may be obtained by modification of existing polymers. Examples are:

1. Styrene-maleic anhydride resins modified by reaction with ethanolamine hydrochloride to give polymers containing primary amino groups and carboxylic acid groups.
2. Polyvinylformamide copolymers having acidic and hydrophobic groups modified by hydrolysis to give free amino groups.
3. Polyallylamine polymers or copolymers modified by reaction with acid anhydrides or acid chlorides to introduce acidic and hydrophobic groups.
4. Hydrophobic carboxyl containing polymers modified by reaction with methyl aziridine to introduce amino groups.

The synthetic resins used in accordance with the present invention are hydrophobic and oleophilic and partially or completely replace the gelatin or other hydrophilic colloid usually used as a binder for silver halide. Generally they have a surface free energy of less than 71 dyne/cm as measured with the surface energy pens supplied by Sherman Treaters Ltd, Thame, Oxon, OX9 3UW, UK. They can be demonstrated to be oleophilic by rubbing a wetted film of the polymer with a lithographic ink. The film will accept the ink, unlike the tannable hydrophilic colloids of the prior art.

Examples of silver halides which can be used in the composition include silver chloride, silver bromide, silver iodide and mixtures thereof. Preparation of the silver halide may be carried out in the conventional manner in gelatin or other hydrophilic colloid, or the silver halide may be formed directly in a solution of the synthetic resin. If desired the silver halide may be formed in gelatin or other hydrophilic colloid which is then removed prior to the halide being redispersed in a solution of the polymer. Preferably the silver halide is formed in a small amount of gelatin or other hydrophilic colloid and then the resultant silver halide emulsion is flocculated, washed to remove dissolved salts, and redispersed in an ammoniacal solution of the synthetic resin such that the colloid preferably comprises less than 20% of the synthetic resin. A suitable average grain size for the silver halide can range from about 0.03 to about 2 microns, preferably 0.03 to 0.5 microns. The silver halide may be sensitised chemically with S,Au,Rh,Se etc. compounds. The silver halide may also be spectrally sensitised with various sensitising dyes. Other additives may also be present with the silver halide such as wetting agents, pigments, antifoggants, stabilisers, bacteriocides etc.

When the radiation sensitive composition of the invention is formed into a radiation sensitive plate, the coat weight of the composition on the substrate can vary from 0.2 to 5 $gm^{-2}$, preferably 0.4 to 2.5 $gm^{-2}$. A typical composition may contain, for example, 0.5 $gm^{-2}$ silver chlorobromide, 0.45 $gm^{-2}$ synthetic resin, and 0.05 $gm^{-2}$ gelatin.

The radiation sensitive layer may have an overcoat of an alkali permeable oleophilic resin as described in G.B. patent 1,571,155. This overcoat provides a further increase in the oleophilicity of the system. Typical overcoats are styrene-maleic anhydride resins, phthaloylated polyvinylbutyrals, carboxyl containing acrylic resins and cellulose acetate phthalate. The tanning-developing agent is preferably present in the overcoat which may also contain dyes, pigments, and small amounts of non-alkali permeable resins.

The term "tanning-development" used herein refers to the development process in which a hardening reaction is caused in a layer of colloid following imagewise exposure. The tanning-developing agents are benzenes or derivatives thereof which each contain at least one hydroxyl group and preferably are polyhydroxybenzenes substituted with one or more of halogen atoms, aryl groups, amino groups, alkyl groups, substituted alkyl groups and alkoxy groups. The tanning-developing agents may be present in the developing solution, the radiation sensitive layer, an underlayer, or the overcoat. Specific examples of suitable tanning-developing agents include hydroquinone, t-butylhydroquinone, catechol, phenylcatechol, pyrogallol, nordihydroguaiaretic acid, and $3,3,3^1$, $3^1$,-tetramethyl-$5,6,5^1$, $6^1$ tetrahydroxyspiro-bis-indane.

The developing solution used when developing the image-wise exposed composition can contain the materials conventionally employed in developer solutions. For example, materials such as NaOH, $K_2CO_3$, $KHCO_3$, $Na_3PO_4$, and sodium silicate are useful as alkaline agents. Conventional superadditives may be present, for example, 1-phenyl-3-pyrazolidone. The superadditive may be added directly to the developing solution or be present in the radiation sensitive plate. Other additives may be used such as sodium sulphate or other inert salt as a swelling suppressant, hydroxylamine salts as antioxidants, 6-nitrobenzimidazole salts and alkali metal halides as antifoggants, and 2-methoxypropanol as solubilising agent. Water softeners, wetting agents, dyes, and pH buffers and the like may also be present. The pH of the developing solution is preferably about 9 to 14 and most preferably about 10 to 13.5. The pH and salt content of the developing solution are adjusted so that swelling but not dissolution of the radiation sensitive layer occurs during the development step.

Subsequent to the tanning-development the unexposed areas are simply washed away to produce a relief image consisting of the tanned areas. This decoating may be effected using water or an alkaline solution. Up to 50% by volume of a water miscible solvent may be present in the decoating solution. A finishing step may be included, such as treatment with acid, hardening with polyvalent ions, baking, etc.

Examples of substrates having a hydrophilic surface which can be used include gelatin coated polyethylene terephthalate, synthetic papers, papers laminated with a synthetic resin film, metallic sheets such as aluminium or zinc, and papers or films laminated with such a metallic foil. Of these, aluminium sheets are preferred for printing and, in particular, those having a grained and anodised surface. The anodised aluminium may also be given a post anodic treatment in, for example, sodium silicate, gum arabic, polyacrylic acid, polyvinylphosphonic acid, vinylphosphonic/acrylic acid copolymer, sodium phosphate, potassium fluorozirconate, tannic acid, or sodium carboxymethylcellulose.

If desired, a hydrophilic subbing layer may be employed between the substrate and the radiation sensitive layer. Suitable examples of subbing layers are those of hydrophilic polymers such as gelatin, gelatin derivatives, polyvinyl alcohol, polyvinylpyrrolidone and sodium carboxymethylcellulose. Hydrophilic polymers containing a primary amino group are preferred.

The following Examples illustrate the invention

EXAMPLE 1

Various polymers were cast into a thin film and tested with the surface energy pens referred to above. The films were also tested for ink receptivity using a lithographic ink.

The polymers used (percentages are by weight) and the results obtained are given in the following Table.

| Polymer | Surface energy, dyne/cm | | | | | Inked in |
|---|---|---|---|---|---|---|
| | 71 | 61 | 51 | 41 | 36 | |
| 15% APMA, 15% MA 20% LMA, 50% MMA | X | X | ✓ | ✓ | ✓ | YES |
| 15% APMA, 17.5% MA 20% LMA, 47.5% MMA | X | X | ✓ | ✓ | ✓ | YES |
| 15% APMA, 20% MA 20% LMA, 45% MMA | X | X | ✓ | ✓ | ✓ | YES |
| 15% APMA, 20% MA 40% LMA, 25% MMA | X | X | ✓ | ✓ | ✓ | YES |
| 15% APMA, 20% MA 40% BA, 25% MMA | X | X | X | X | ✓ | YES |
| 15% APMA, 10% MA 75% MMA | X | X | ✓ | ✓ | ✓ | YES |
| 15% APMA, 20% AA 20% BAM, 45% MMA | X | X | ✓ | ✓ | ✓ | YES |
| 10% APMA, 17.5% MA 40% LMA, 32.5% MMA | X | X | ✓ | ✓ | ✓ | YES |
| 15% AEM, 18% MA 67% MMA | X | ✓ | ✓ | ✓ | ✓ | YES |
| 15% AEM, 20% MA 20% LMA, 45% MMA | X | X | ✓ | ✓ | ✓ | YES |
| For Comparison: | | | | | | |
| Gelatin | ✓ | ✓ | ✓ | ✓ | ✓ | NO |
| Phthallated Gelatin | ✓ | ✓ | ✓ | ✓ | ✓ | NO |
| Polyvinyl alcohol | ✓ | ✓ | ✓ | ✓ | ✓ | NO |

APMA = N-(3-amino propyl) methacrylamide hydrochloride
AEM = 2-amino ethyl methacrylate hydrochloride
BA = n-butyl acrylate
MA = methacrylic acid
MMA = methyl methacrylate
LMA = lauryl methacrylate
AA = acrylic acid
BAM = N-t-Butyl acrylamide In the Table:

✓=film surface remained wetted by the surface fluid for 2 seconds, showing that the polymer surface energy was greater than that of the fluid.

X=film surface repelled the surface energy fluid, showing that the polymer surface energy was less than that of the fluid.

EXAMPLE 2

In a 500 ml round bottomed flask equipped with stirrer, condenser and nitrogen inlet/exit was placed a solution of 4.0 g 2-aminoethylmethacrylate hydrochloride in 105 ml water. To this solution was added a solution of 17.6 g methylmethacrylate 4.7 g methacrylic acid 50 mg azoisobutyronitrile 200 ml isopropanol The solution was stirred under nitrogen for 18 hours at 85°–90°. After 6 and 12 hour intervals, further 50 mg portions of azoisobutyronitrile were added. After 18 hours, the solids content of the solution was 8.5% with negligible monomer content.

To 50 ml of the above polymer solution was added 0.880 ammonia solution. A precipitate was produced which redissolved in more ammonia. Sufficient ammonia was added to just give a clear solution. This solution was added to 60 ml of a sensitised silver iodobromide emulsion containing 150 gl$^{-1}$ AgBr$_{0.98}$I$_{0.02}$ and 14 gl$^{-1}$ gelatin. The resulting emulsion was filtered and coated onto grained and anodised aluminium to obtain a radiation sensitive plate. The plate was dried at 100° C., and gave a dry coat weight of 1.2 gm$^{-2}$.

The plate was image-wise exposed to light and developed for 30 seconds at 25° C. in a developing solution consisting of equal parts of solutions A and B.

| Solution A | |
|---|---|
| Pyrogallol | 3.0 g |
| Metol | 1.0 g |
| Citric Acid | 1.0 g |
| Water | 500 ml |
| Solution B | |
| K$_2$CO$_3$ | 200 g |
| KBr | 1.0 g |
| Water | 500 ml |

The plate was washed with water, and the unexposed areas removed with the assistance of a little light rubbing. The plate was soaked in dilute acid, washed and dried. On damping the plate with water and rubbing with a lithographic ink, the image areas picked up the ink.

A control plate in which the polymer was replaced by gelatin gave a similar imaged plate but the image areas would not accept ink.

EXAMPLE 3

In a 500 ml round bottomed flask equipped with stirrer, condenser and nitrogen inlet/exit was placed a solution of 6.0 g N-(3-aminopropyl)methacrylamide hydrochloride in 60 ml distilled water. To this solution was added a solution of 18 g methylmethacrylate 8 g methacrylic acid 8 g laurylmethacrylate 50 mg azoisobutyronitrile 260 ml isopropanol The solution was stirred under nitrogen for 18 hours at 85°–90°. After 6 and 12 hour intervals, further 50 mg portions of azoisobutyronitrile were added. The final solids content of the polymer solution was 13% w/w and the residual monomer content was low.

30 ml of the above polymer was dissolved in 110 ml water plus 0.9 ml 0.880 ammonia. 25 ml of a sensitised silver chlorobromide emulsion (containing 12.8 gl$^{-1}$ gelatin and 175 gl$^{-1}$ AgCl$_{0.3}$Br$_{0.7}$) was added. The mixture was filtered, coated onto grained and anodised aluminium and dried at 100° C. to form a radiation sensitive plate. The dry coat weight was 0.6 gm. An overcoat solution was applied, consisting of:

1.5 g phthaloylated polyvinylbutyral 1.0 g 4-phenyl catechol 0.2 g Microlith Blue 4GK-P (a predispersed Cu-phthalocyanine pigment from Ciba Geigy).

100 ml Methylethyl Ketone.

The overcoat was dried at 100° C., giving a dry overcoat weight of 1.0 gm$^{-2}$. The plate was contact exposed to light through a negative, developed in 15% aqueous K$_2$CO$_3$ solution for 30 seconds at 30° C., and washed with water. The unexposed areas decoated in water with the aid of a little rubbing. The plate was soaked in 2% acetic acid, washed with water, rubbed down with gum arabic solution, and dried. The plate had a blue-black image on a white background. The plate was placed on a Didde Glaser web offset press. 50,000 acceptable prints were produced.

A control plate in which gelatin replaced the polymer was made similarly. Only 10,000 acceptable prints could be produced.

We claim:

1. A radiation sensitive lithographic printing plate precursor adapted for tanning development comprising a hydrophilic substrate bearing a radiation sensitive composition comprising
   (a) a silver halide photosensitive material and a hydrophilic colloid in admixture with
   (b) a hydrophobic, tannable, oleophilic synthetic resin wherein said resin is soluble in an alkaline aqueous solution, said resin being selected from the group consisting of a styrene-maleic anhydride resin modified by reaction with ethanolamine hydrochloride to provide primary amino groups and carboxylic acid groups; a polyvinyl formamide copolymer having acidic and hydrophobic groups modified by hydrolysis to produce free amino groups; a polyallylamine polymer or copolymer modified by reaction with an acid anhydride and acid chloride to provide acidic and hydrophobic groups; or a hydrophobic carboxyl-containing polymer modified by reaction with methyl aziridine to provide amino groups
   (c) said hydrophilic colloid comprising less than 20% by weight of said resin.

2. A method of preparing a lithographic printing plate comprising:
   (a) providing a radiation sensitive composition by
      (1) dissolving a hydrophobic, tannable, oleophylic synthetic resin in an alkaline aqueous solution, said resin containing (i) 1 to 20 mole percent of repeating primary amino units derived from an ethylenically unsaturated monomer containing one or more primary amino groups, (ii) 5 to 40 mole percent of sulphonamide repeating units or acidic repeating units selected from the group consisting of carboxylic, sulphonic, phosphoric, sulphinic and phosphinic acid groups derived from an ethylenically unsaturated monomer containing one or more acidic groups, and (iii) 10 to 85 mole percent of hydrophobic repeating units derived from an ethylenically unsaturated monomer containing at least one hydrophobic unit; and
      (2) admixing said solution with a silver halide photosensitive material in admixture with a hydrophilic colloid to provide a radiation sensitive composition, said hydrophilic colloid comprising less than 20% by weight of said resin,
   (b) coating said radiation sensitive composition onto a substrate having a hydrophilic surface,
   (c) image-wise exposing said composition to actinic radiation;
   (d) subjecting the image-wise exposed composition to tanning-development in the presence of a tanning-development agent whereby the radiation-struck areas of the composition become tanned, and
   (e) washing out the untanned areas of the composition to reveal the hydrophilic surface of the substrate while leaving the tanned areas of the composition as an oleophilic relief image.

3. The process of claim 2 wherein said tanning agent is benzene or a derivative thereof containing at least one hydroxyl group and step (d) is conducted in the presence of an alkaline agent.

4. The process of claim 2 wherein said synthetic resin has an isoelectric point of 4 to 8 and a number average molecular weight in the range of 5,000 to 200,000.

5. The process of claim 2 wherein said resin is prepared by copolymerizing ethylenically unsaturated monomers.

6. The process of claim 5 wherein at least one monomer contains groups selected from the group consisting of carboxylic, sulphonic, phosphinic, sulphinic and phosphonic acid groups.

7. The process of claim 2 wherein said tanning development agent is selected from the group consisting of hydroquinone, t-butylhydroquinone, catechol, phenyl catechol, pyrogallol, nordihydroguaiaretic acid, and 3,3,3',3'-tetramethyl-5,6,5',6'-tetrahydroxyspiro-bis-indane.

8. A radiation sensitive lithographic printing plate precursor adapted for tanning development comprising a hydrophilic substrate bearing a radiation sensitive composition comprising
   (a) a silver halide photosensitive material and a hydrophilic colloid in admixture with
   (b) a hydrophobic, tannable, oleophilic synthetic resin wherein said resin is soluble in an alkaline aqueous solution, said resin containing
      (1) 1 to 20 mole percent of primary amino repeating units derived from an ethylenically unsaturated monomer containing one or more primary amino groups,
      (2) 5 to 40 mole percent of sulphonamide repeating units or acidic repeating units selected from the group consisting of carboxylic, sulphonic, phosphonic, sulphinic and phosphinic acid groups derived from an ethylenically unsaturated monomer containing one or more acidic groups, and
      (3) 10 to 85 mole percent of hydrophobic repeating units derived from an ethylenically unsaturated monomer containing at least one hydrophobic unit,
   (c) said hydrophilic colloid comprising less than 20% by weight of said resin.

9. The plate of claim 8 wherein said synthetic resin has an isoelectric point of 4 to 8 and a number average molecular weight in the range of 5,000 to 200,000.

10. The plate of claim 8 wherein said synthetic resin is prepared using a primary amino group-containing monomer selected from the group consisting of N-(3-aminopropyl)methacrylamide, N-(2-aminoethyl)methacrylamide, 2-aminoethyl methacrylate, 2-aminoethylacrylate, 3-aminopropylacrylate, 3-amino-2-hydroxy-propylmethacrylate, and allylamine; the acidic group-containing monomer is selected from the group consisting of methacrylic acid, acrylic acid, itaconic acid, maleic acid, and butyl hydrogen maleate; and the hydrophobic group-containing monomer selected from the group consisting of methyl methacrylate, ethyl acrylate, butyl acrylate, lauryl methacrylate, N-tert-butylacrylamide, N-tert-octylmethacrylamide, and styrene.

11. The plate of claim 8 wherein the monomers providing units (1), (2) and (3) of said synthetic resin are copolymerized with a monomer selected from the group consisting of acrylonitrile; N,N-dimethylaminoethyl methacrylate; acrylamide; 2-hydroxyethylmethacrylate; and 2-acrylamido-2-methylpropanesulphonic acid.

* * * * *